United States Patent
Saito

[11] Patent Number: 6,159,298
[45] Date of Patent: Dec. 12, 2000

[54] THERMAL PROCESSING SYSTEM

[75] Inventor: Yukimasa Saito, Sagamihara, Japan

[73] Assignee: Tokyo Electron Limited, Tokyo-To, Japan

[21] Appl. No.: 09/216,937

[22] Filed: Dec. 21, 1998

[30]     Foreign Application Priority Data

Dec. 27, 1997  [JP]  Japan .................................. 9-369494

[51] Int. Cl.$^7$ .................................................. C23C 16/00
[52] U.S. Cl. ............................................................ 118/715
[58] Field of Search ............................. 118/715; 156/345

[56]              References Cited

FOREIGN PATENT DOCUMENTS 4-150903   5/1992   Japan .
7-130674   5/1995   Japan .

*Primary Examiner*—Richard Bueker
*Assistant Examiner*—Erin Fieler
*Attorney, Agent, or Firm*—Smith, Gambrell & Russell, LLP

[57]              ABSTRACT

A silicon nitride ($Si_3N_4$) film and a silicon oxide ($SiO_2$) film, for example, are successively formed on the surface of semiconductor wafers by the same thermal processing system 3, to form a multilayer insulating structure. A disk trap 5, a valve MV and a water cooled trap 6 are provided in this order in an exhaust gas passage 41 extending from a thermal processing unit 3. A heater 44 is provided to heat the section of the passage 41 upstream of the water-cooled trap 6 as well as the valve MV. Another heater 51 is provided to heat the disk trap 5. A film of $Si_3N_4$ is formed on the wafer surface by heating the section of the passage upstream of the water-cooled trap and by heating the disk trap and the valve while cooling the water-cooled trap, to thereby trap a by-product of $NH_4Cl$. A film of $SiO_2$ is then formed on the film of $Si_3O_4$ by heating the section of the exhaust passage upstream of the disk trap 5 to trap a by-product of $C_xH_y$ in the disk trap. The valve is closed when processed wafers are transferred out of the thermal processing unit, to prevent reverse flow of a by-product of $NH_4Cl$ into the thermal processing unit through the water-cooled trap 6.

7 Claims, 6 Drawing Sheets

| PROCESSING GAS PROCESS | WAFER LOADING PROCESS | NH₃SiH₂Cl₂ FIRST FILM FORMING PROCESS (Si₃N₄) | EVACUATING PROCESS | TEOS SECOND FILM FORMING PROCESS (SiO₂) | WAFER UNLOADING |
|---|---|---|---|---|---|
| EXHAUST SYSTEM | | HEAT EXHAUST PIPE AND DISK TRAP AT 150°C | | HEAT EXHAUST PIPE AT 150°C AND KEEP DISK TRAP AT ORDINARY TEMP. (25°C) | |
| REMOVAL OF BY-PRODUCT | | TRAP NH₄Cl BY WATER COOLED TRAP | | TRAP SiO₂ AND C$_x$H$_y$ BY DISK TRAP | |

FIG.4

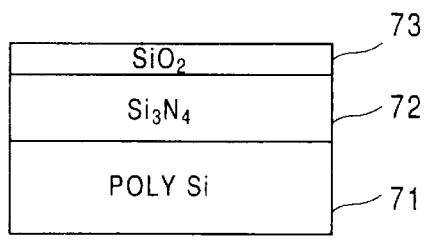

FIG.5

THERMAL PROCESSING SYSTEM

BACKGROUND OF THE INVENTION

1. Field of the Invention

The present invention relates to a thermal processing system capable of forming a multilayer film consisting of a plurality of films of different compositions, such as a nitride film and an oxide film.

2. Description of the Related Art

The integration size of semiconductor integrated circuits including DRAMs (dynamic random-access memories) has progressively been increasing in recent years, and various efforts have been made to improve the configuration of semiconductor integrated circuits and methods of fabricating such semiconductor integrated circuits. For example, studies have been made of the use of multilayer films, such as $SiO_2/Si_3N_4/SiO_2$ films and $SiO_2/Si_3N_4$ films, as capacitor insulating films for DRAMs to secure a sufficient dielectric strength for corners of trenches and to lower process temperature.

The improvement of the quality of thin films has become more important to provide integrated circuits with enhanced reliability. For example, oxygen contained in a $Si_3N_4$ (silicon nitride) film reduces the dielectric constant and the long-term reliability of the $Si_3N_4$ film. Therefore, a vertical thermal processing system which does not drag much air into a reactor is suitable for forming a multilayer insulating film including a $Si_3N_4$ film.

When forming a $SiO_2/Si_3N_4$ film on major surfaces of semiconductor wafers (hereinafter referred to simply as "wafers"), i.e., workpieces, a wafer holder holding the wafers is placed in a low-pressure CVD (LPCVD) reactor of a first vertical thermal processing system as shown in FIG. 6, and processing gases, such as $NH_3$ and $SiH_2Cl_2$ gas, are supplied into the LPCVD reactor to deposit a $Si_3N_4$ (silicon nitride) film on the major surfaces of the wafers. Then, the wafer holder is taken out of the LPCVD reactor, the wafers are transferred from the wafer holder to a wafer carrier, and the wafer carrier containing the wafers is carried to a second thermal processing system as shown in FIG. 7, and a $SiO_2$ (silicon dioxide) film is deposited over the $Si_3N_4$ film by the second thermal processing system using a processing gas, such as tetraethoxysilane gas (abbreviated to "TEOS"). Thus, the $Si_3N_4$ film and the $SiO_2$ film are deposited in that order on a polysilicon layer to form a multilayer insulating film as shown in FIG. 5.

As shown in FIG. 6, the first thermal processing system 1 for forming the $Si_3N_4$ film comprises a thermal processing unit 11, a processing gas source 13 connected through a gas supply pipe 12 and a valve V1 to the thermal processing unit 11, an exhaust system including a vacuum pump 16 connected through an exhaust pipe 14 provided with a main valve MV and a water-cooled trap 15 to the thermal processing unit 11, a pressure sensor S1 connected through a valve V2 to the exhaust pipe 14, a pressure sensor S2 connected to the gas exhaust pipe 14, and a heater 17 for heating the main valve MV and a section of the exhaust pipe 14 between the exhaust port of the thermal processing unit 11 and the water-cooled trap 15.

When forming the $Si_3N_4$ film, $NH_4Cl$ (ammonium chloride) power is produced as a by-product as shown by the following reaction formula.

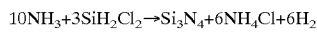

$$10NH_3+3SiH_2Cl_2 \rightarrow Si_3N_4+6NH_4Cl+6H_2$$

The deposition of $NH_4Cl$ inside the main valve MV and the exhaust pipe 14 when the vacuum pump 16 is operated and the main valve MV is opened can be prevented if the exhaust valve 14 and the main valve MV is heated to a temperature on the order of 150° C. by the heater 17. The gas exhausted from the thermal processing unit 11 is cooled by the water-cooled trap 15 to trap $NH_4Cl$. This prevents the reduction of the suction ability of the vacuum pump 16 and the corrosion of the component parts of the vacuum pump 16 attributable to the corrosive action of the reaction by-products and the unused source gas, as well as the reduction of the conductance of the exhaust system.

The main valve MV is closed when loading wafers W into or unloading the same from the thermal processing unit 11 to prevent causing particles by a reverse flow of the $NH_4Cl$ powder trapped by the water-cooled trap 15 through the main valve MV and the exhaust pipe 14 into the thermal processing unit 11.

As shown in FIG. 7, the second thermal processing system 2 for forming the $SiO_2$ film comprises a thermal processing 21, a processing gas 23 connected through a gas supply pipe 22 and a valve V1 to the thermal processing unit 21, an exhaust system including a vacuum pump 26 connected through an exhaust pipe 24 provided with a disk trap 25 and a main valve MV to the thermal processing unit 21, a pressure sensor S1 connected through a valve V2 to the exhaust pipe 24, a pressure sensor S2 connected to the gas exhaust pipe 24, and a heater 27 for heating the main valve MV and a section of the exhaust pipe 14 between the exhaust port of the thermal processing unit 21 and the main valve MV. The disk trap 25 is kept at an ordinary temperature.

When forming the $SiO_2$ film by using TEOS, $C_xH_y$ (x and y are natural numbers) is produced as a by-product as shown by the following reaction formula.

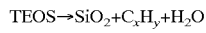

$$TEOS \rightarrow SiO_2+C_xH_y+H_2O$$

It is difficult to trap the $C_xH_y$ by simple cooling. Therefore, the conductance of the exhaust system is reduced by the disk trap 25 to trap $C_xH_y$ to prevent the reduction of the suction ability of the vacuum pump 26 and the corrosion of the components of the vacuum pump 26. The disk trap 25 is disposed on the upstream side of the main valve MV, i.e., on the side of the thermal processing unit 21 with respect to the main valve MV, to prevent the deposition of $C_xH_y$ inside the main valve MV having a conductance smaller than that of the exhaust pipe 14 to intercept the flow of $C_xH_y$ to the main valve MV.

When forming the multilayer insulating film by using the separate thermal processing apparatuses 1 and 2, the wafers W needs to be conveyed from the thermal processing system 1 to the second thermal processing system 2. An oxide film is formed over the $Si_3N_4$ film by natural oxidation while the wafers are being conveyed from the first thermal processing system 1 to the second thermal processing system 2. Particularly, formation of an oxide film of an uneven thickness by natural oxidation is inevitable when a door at the bottom of the thermal processing unit 11 is opened after the completion of film formation in the LPCVD reactor, because the flow of some air into the LPCVD reactor is unavoidable and the surface of the hot Si3N4 film is exposed unavoidably to air. It is difficult to remove the oxide film formed by natural oxidation completely by cleaning before the subsequent oxidation process. When transferring the wafers to a wafer holder under the thermal processing unit 21 (oxidation reactor) of the second thermal processing system 2, the further growth of the oxide film formed by natural oxidation is unavoidable because the wafers are exposed to air in an environment of a considerably high temperature under the thermal processing unit 21. Consequently, the $SiO_2$ film is formed in the thermal processing unit 21 over the oxide film formed by natural oxidation. Thus, the multilayer insulating film including the oxide film of a low film quality reduces the reliability of integrated circuits, such as DRAMs, fabricated on the wafers.

Furthermore, the wafers are liable to be contaminated with particles because the wafers are exposed many times when taking the wafers out of the LPCVD reactor, putting the wafers in a wafer carrier, carrying the wafers and loading the wafers into the oxidation reactor for the next process. Since the multilayer insulating film is very thin and further reduction of the thickness will be necessary to meet the requirements of future DRAMs of increased integration sizes, the performance of the multilayer insulating film is deteriorated even by the contamination of the multilayer insulating film with only a few particles. Such a problem applies also to a multilayer insulating film consisting of $SiO_2$ film and a $Si_3N_4$ film formed on the former.

It is difficult to form multilayer insulating films, such as $SiO_2/Si_3N_4/SiO_2$ films and $SiO_2/Si_3N_4$ films, in satisfactory film quality by using those separate thermal processing systems, and difficulty in forming multilayer insulating films of satisfactory film quality has been an impediment to fabricating integrated circuits, such as DRAMs, having increased integration sizes.

In the semiconductor device fabricating industry, importance has been attached to the manufacturing cost of wafers required by a semiconductor chip production line and efforts have been made to reduce the manufacturing cost. However, it is reported that the curtailment of actual processing time is more important than the reduction of the manufacturing cost in recent years in view of reducing time necessary for the development of an semiconductor chip fabricating line and that the curtailment of actual processing time will become as important as the reduction of the manufacturing cost.

The inventor of the present invention considered that both the reduction of the wafer manufacturing cost and the curtailment of actual processing time can be achieved and problems attributable to the oxide film formed by natural oxidation and the contamination of wafers with particles while wafers are being transferred from one to another thermal processing system can be solved if a $Si_3N_4$ film and a $SiO_2$ film, which have been formed by separate thermal processing systems, are formed by a single thermal processing system, and had made studies to that effect.

If a $Si_3N_4$ film and a $SiO_2$ film are formed by the first thermal processing system 1 shown in FIG. 6 simply by changing the processing gases for the $Si_3N_4$ film and the $SiO_2$ film, respectively, whereas $NH_4Cl$, i.e., a by-product of the $Si_3N_4$ film forming process, can be effectively trapped by the water-cooled trap 15, $C_xH_y$, i.e., a by-product of the $SiO_2$ film forming process, deposits inside the main valve MV having a conductance lower than that of the exhaust pipe 14 because the water-cooled trap 15 is disposed on the downstream side of the main valve MV.

On the other hand, if a $Si_3N_4$ film and a $SiO_2$ film are formed by the second thermal processing system 2 shown in FIG. 7 simply by changing the processing gases for the $Si_3N_4$ film and the $SiO_2$ film, respectively, $C_xH_y$ can be effectively trapped by the disk trap 25, and $NH_4Cl$ also can be trapped because the temperature, i.e., an ordinary temperature, of the disk trap 25 is lower than the temperature of about 150° C. of a section of the exhaust pipe 24 on the upstream side of the disk trap 25. However, since the disk trap 25 is on the upstream side of the main valve MV, it is possible that particles of NH4Cl flow reverse into the thermal processing unit 21 through the exhaust pipe 24 and adhere to the wafers even if the main valve MV is closed when loading wafers into and unloading the same from the thermal processing unit 21. Moreover, it is possible that the disk of the disk trap 25 is clogged with the trapped $NH_4Cl$ powder and the thermal processing unit 21 may not properly be evacuated.

The present invention has been made in view of those problems and it is therefore an object of the present invention to provide a thermal processing system capable of successively forming, for example, both a nitride film and an oxide film to construct a multilayer film.

SUMMARY OF THE INVENTION

According to the present invention, a thermal processing system comprises: a single thermal processing unit for of successively processing an object to be processed in a hot atmosphere by both a first thermal process which produces a by-product having a property of drifting and not depositing in an exhaust passage even if the passage has a small conductance, and a second thermal process which produces a by-product having a property of adhering to the passage if the passage has a small conductance; the exhaust passage being connected to the thermal processing unit; a first trap provided in the exhaust passage; a valve provided in the exhaust passage downstream of the first trap with respect to a flowing direction of a gas in the exhaust passage; a second trap provided with cooling means and disposed in the exhaust passage downstream of the valve with respect to the flowing direction of the gas in the exhaust passage; means for heating a section of the exhaust passage upstream of the first trap; means for heating the first trap; means for heating the exhaust passage between the first trap and the second trap as well as said valve; all of the heating means being operated to prevent deposition of the by-product and the second trap being cooled to arrest the by-product, while the first thermal process is being carried out; and at least the means for heating a portion of the exhaust passage upstream of the first trap being operated to prevent deposition of the by-product, and the first trap operating to arrest the by-product while said second thermal process is being carried out.

The first thermal process may be a film forming process which produces ammonium chloride as a by-product, and the second thermal process may be a film forming process which uses, an organic silicon compound as a source gas to form a silicon dioxide film.

BRIEF DESCRIPTION OF THE DRAWINGS

FIG. 4 is a timing chart for explaining a series of operations for forming a multilayer insulating film to be carried out by the thermal processing system of the present invention;

FIG. 5 is a sectional view of a multilayer insulating film formed on a wafer;

DESCRIPTION OF THE PREFERRED EMBODIMENTS

Figure 1:
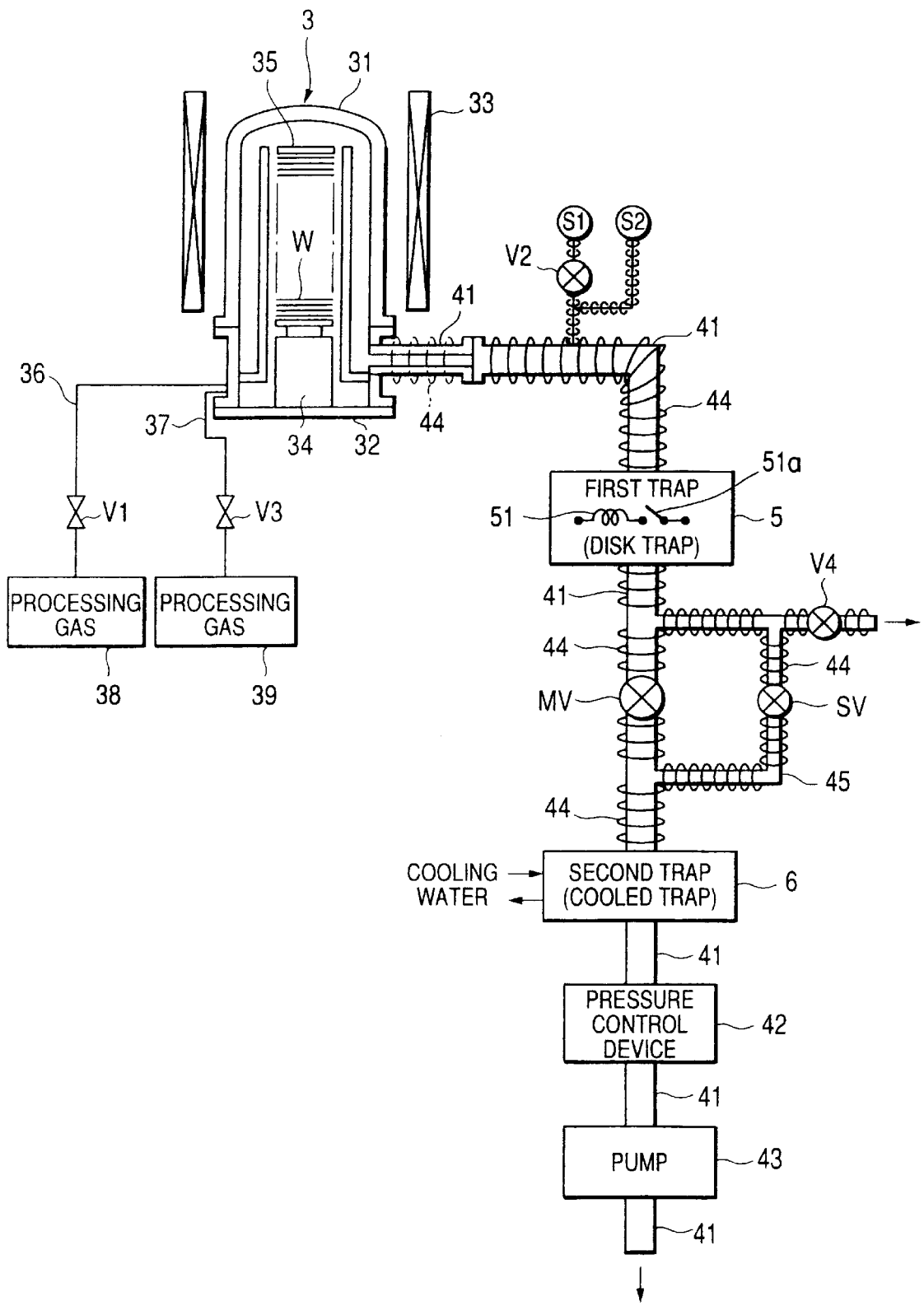
FIG. 1 is schematic view of a thermal processing system in a preferred embodiment of the present invention.

Referring to FIG. 1 showing a vertical thermal processing system in a preferred embodiment of the present invention as applied to forming a multilayer insulating film consisting of a $SiO_2$ film and a $Si_3N_4$ film, the thermal processing system comprises, as principal components, a thermal processing unit 3 having a reactor 31, a first processing gas source 38 connected to the reactor 31 of the thermal processing unit 3 through a gas supply pipe 36 provided with an on-off valve V1, a second processing gas source 39 connected to the reactor 31 through a gas supply pipe 37 provided with an on-off valve V3, an exhaust pipe 41 forming a main exhaust passage and having one end connected to the reactor 31, a disk trap 5, i.e., a first trap, which will be described later, a main valve MV, a water-cooled trap 6, i.e., a second trap, which will be described later, a pressure control device 42 for controlling the pressure in the reactor 31, a vacuum pump 43, a first heater 44, i.e., first heating means 44, for heating sections of the exhaust pipe 41 between an exhaust port of the reactor 31 and the disk trap 5 and between the disk trap 5 and the water-cooled trap 6, and a second heater 51, i.e., a second heating means, for heating the disk trap 5. The disk trap 5, the main valve MV, the water-cooled trap 6 and the pressure control device 42 are arranged in that order from the exhaust port of the reactor 31 toward the vacuum pump 43 on the exhaust pipe. The second heater 51 can be optionally controlled by a switch 51a, which is closed to use the second heater 51 for heating the disk trap 5. A pressure sensor S1 is connected through an on-off valve V2 and a pressure sensor S2 is connected directly to a part of the exhaust pipe 51 between the thermal processing unit 3 and the disk trap 5.

The first source gas or processing gas source 38 supplies $NH_3$ gas and $SiH_2Cl_2$ gas for forming a $Si_3N_4$ film into the reactor 31. The second source gas or processing gas source 39 supplies tetraethoxysilane (TEOS) gas for forming a $SiO_2$ film into the reactor 31.

The thermal processing unit 3 has the reactor 31 of a double-wall structure having an open lower end capable of being sealed by a cap 32, a heating furnace 33 surrounding the reactor 31, a heat insulating tube 34 placed in the reactor 31, and a wafer boat 35 mounted on the heat insulating tube 34. The processing gases are supplied through the gas supply pipes 36 and 37 into the reactor 31. Unused processing gases and by-products are exhausted from the reactor 31 through the exhaust pipe 41.

A bypass pipe 45 forming an auxiliary exhaust passage and having a conductance lower than that of the main exhaust passage 41 is connected in parallel with the part of the exhaust pipe 41 having the main valve MV. An auxiliary valve SV is provided in the bypass pipe 45 to stop the flow of gases through the bypass pipe 45. A valve V4 is connected to a part of the bypass exhaust pipe on the upstream side of the main valve MV. The valve V4 is opened when discharging gases of a positive pressure supplied into the reactor 31. The bypass pipe 41 can be heated by the first heater 44. When evacuating the reactor 31 of the thermal processing unit 3 to a high vacuum, first the main valve MV is closed, the auxiliary valve SV is opened to evacuate the reactor 31 only through the bypass pipe 45 to, for example, 5 torr, and then only the main valve MV is opened to further evacuate the reactor 31 only through the main exhaust pipe 41, or both the main valve MV and the auxiliary valve SV are opened to further evacuate the reactor 31 through both the main exhaust pipe 41 and the bypass pipe 45 to a vacuum suitable for a film forming process of, for example, $10^{-3}$ torr or below. Thus, the air contained in the reactor 31 is sucked at a low flow rate in the initial stage of a reactor evacuating operation to prevent stirring and blowing up particles accumulated in the reactor 31.

Figure 2A:
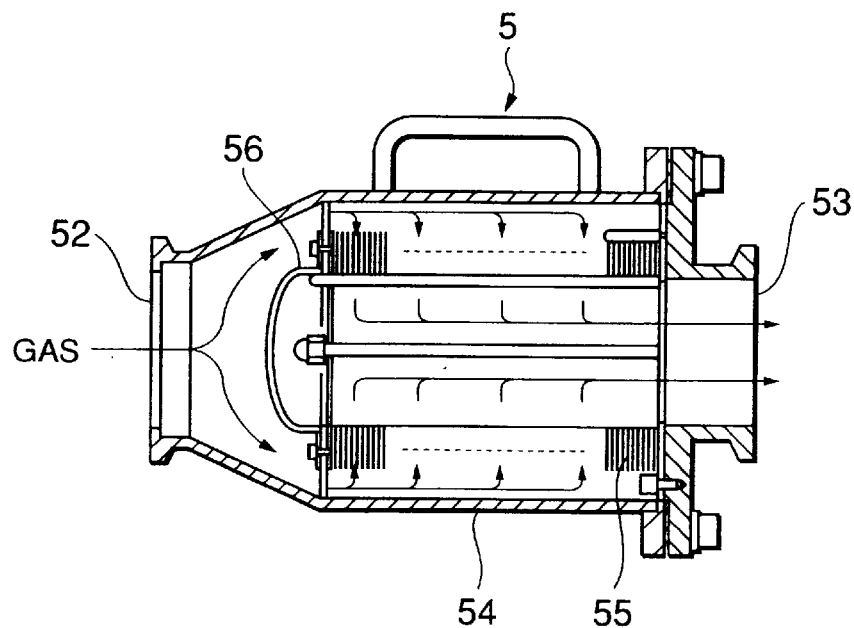
FIGS. 2a and 2b are a longitudinal sectional view and an end view, respectively, of a disk trap.
Figure 2B:
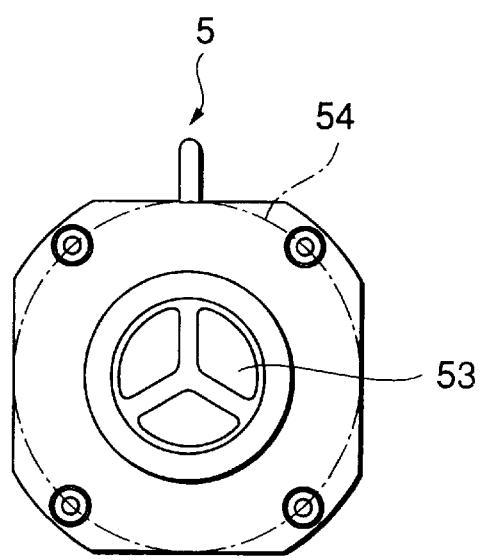

Referring to FIGS. 2a and 2b showing the disk trap 5 in a longitudinal sectional view and an end view, respectively, the disk trap 5 has a substantially tubular housing 54 provided with an inlet opening 52 and an outlet opening 53 formed respectively at its opposite ends, a disk assembly 55 contained in the housing 54, and a cover 56 attached to the inlet end of the disk assembly 55. The disk assembly 55 is provided with a plurality of annular disks arranged in an axial row at predetermined intervals, and has the shape of a tube having opposite open ends. The open end on the side of the inlet opening 52 is covered with the cover 56. The disk trap 5 is provided with the heater 51, not shown in FIGS. 2a and 2b. The heater 51 may be formed so as to surround the disk trap 5 or may be built in the disk trap 5.

A gas flowed through the inlet opening 52 into the disk trap 5 flows into an annular space defined by the outer circumference of the disk assembly 55 and the inner circumference of the housing 54, flows through spaces between the disks of the disk assembly 55 and flows into a cylindrical space defined by the disk assembly 55 as indicated by the arrows in FIG. 2a. The spaces between the disks has a small conductance. Therefore, substances having the property of depositing if the passage thereof has a small conductance, such as $C_xH_y$ produced when forming a $SiO_2$ film by using TEOS, adheres to the surfaces of the disks and is trapped by the disk trap 5. The exhaust gas thus cleared of $C_xH_y$ flows outside through the outlet opening 53.

Figure 3A:
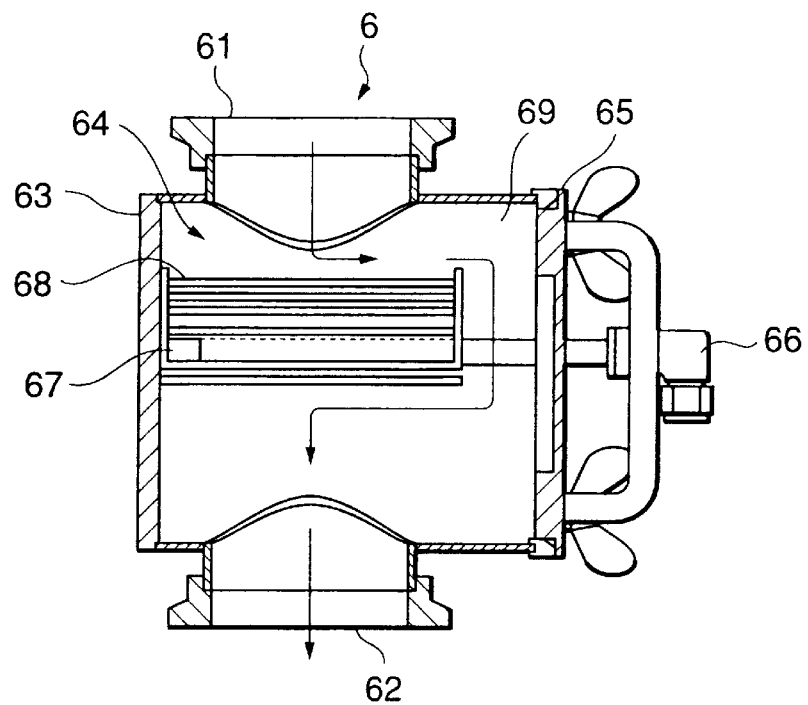
FIGS. 3a and 3b are a longitudinal sectional view and an end view, respectively, of a water-cooled trap.
Figure 3B:
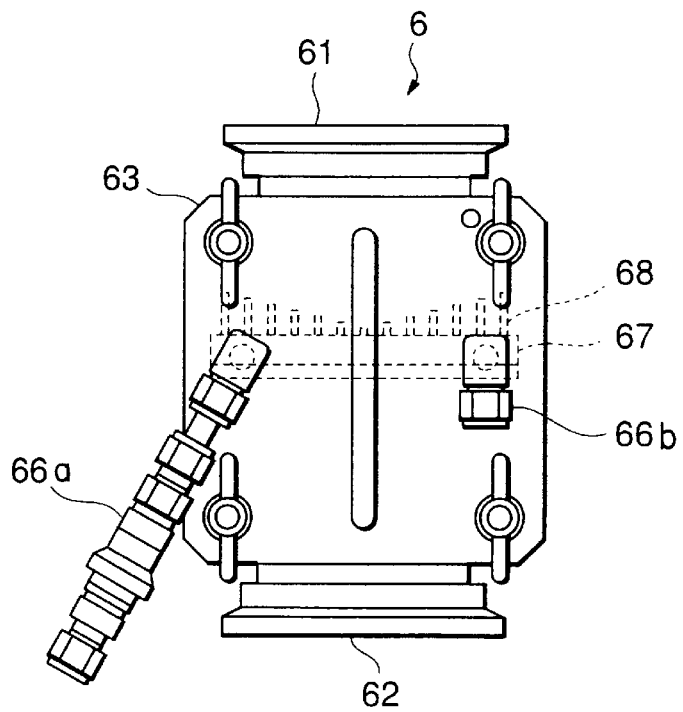
Figure 6:
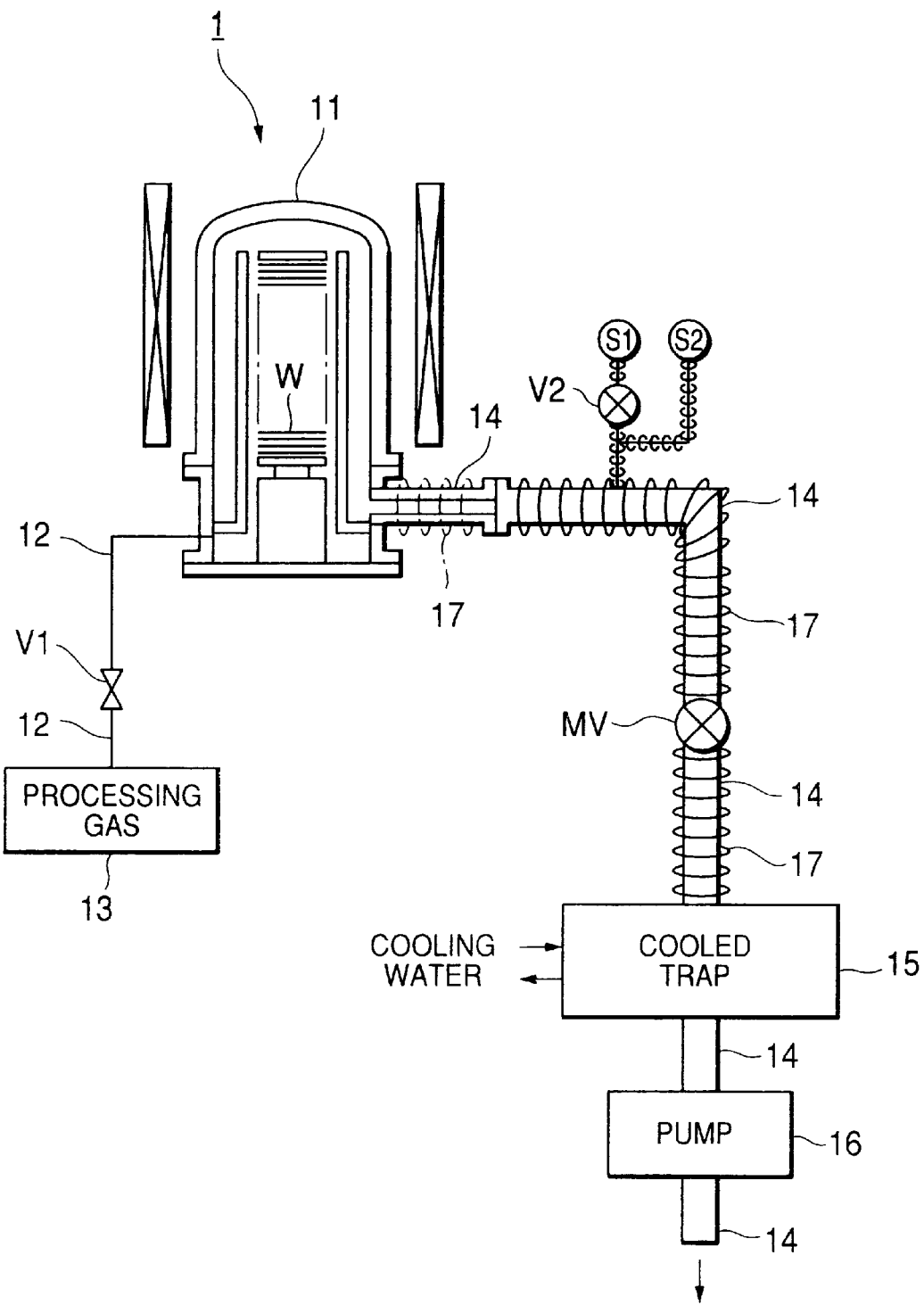
FIG. 6 is a schematic view of a conventional thermal processing system for forming a $Si_3N_4$ film.
Figure 7:
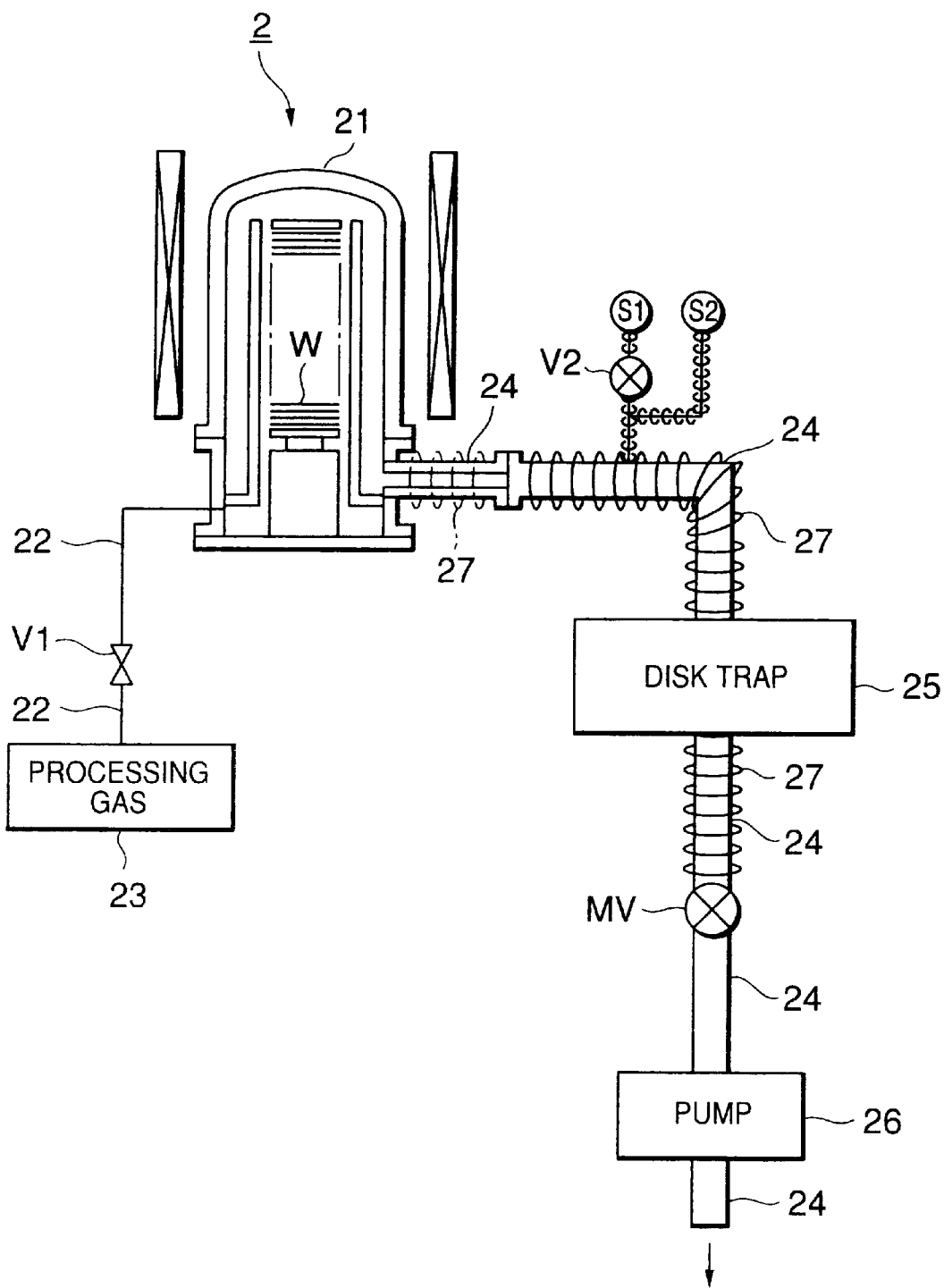
FIG. 7 is a schematic view of a conventional thermal processing system using TEOS for forming a $SiO_2$ film.

Referring to FIGS. 3a and 3b showing the water-cooled trap 6 in a longitudinal sectional view and an end view, respectively, the water-cooled trap 6 has a housing 63 provided with a gas inlet opening 61 and a gas outlet opening 62 formed respectively at its opposite ends, a cooling device 64 inserted in the housing 63, a cover 65 supporting the cooling device 64 and hermetically covering one open end of the housing 63, a water supply line 66a and a water discharge line 66b. Water supplied through the water supply line 66a flows through the cooling device 64 and is discharged through the water discharge line 66b. The cooling device 64 has a heat exchanger 67 through which cooling water flows. The heat exchanger 67 is provided with a plurality of cooling fins 68. The heat exchanger 67 is disposed opposite to the gas inlet opening 61 and the gas outlet opening 62 with the cooling fins 68 extended toward the gas inlet opening 61 as shown in FIG. 3b so as to obstruct the straight flow of the gas from the gas inlet opening 61 toward the gas outlet opening 62 and so as to form a roundabout passage 69.

The exhaust gas flows through the gas inlet opening 61 into the water-cooled trap 6, impinges on the cooling device 64 as indicated by the arrow in FIG. 3a, and is cooled effectively as the same flows along the cooling fins 68. Consequently, a substance which deposits when cooled, such as ammonium chloride ($NH_4Cl$) produced as a by-product when a $Si_3N_4$ film is formed by using $NH_3$ gas and $SiH_2Cl_2$ gas as processing gases, deposits on the cooling device 64. Thus, $NH_4Cl$ is trapped. The exhaust gas thus cleared of $NH_4Cl$ flows through the roundabout passage 69 and flows out of the water-cooled trap 6 through the gas outlet opening 62.

A method of forming a multilayer insulating film consisting of a $SiO_2$ film and a $Si_3N_4$ film by using this thermal processing system will be described with reference to FIGS. 4 and 5. First, a wafer loading process shown in FIG. 4 is carried out. In the wafer loading process, the reactor 31 is heated by the heating furnace 33 so that the interior of the reactor 31 is heated uniformly at, for example, 400° C., the wafer boat 35 holding, for example, fifty wafers W in a parallel arrangement is loaded into the rector 31, power is supplied to the heaters 44 and 51 to heat the exhaust pipe 41, the disk trap 5, the main valve MV, the auxiliary valve SV and the bypass pipe 45, for example, at 150° C., and cooling water is passed through the water-cooled trap 6 for cooling. Then, the main valve MV is closed, the auxiliary valve SV is opened and the vacuum pump 53 is operated to evacuate the reactor 31 gradually through the bypass pipe 45 to a vacuum on the order of, for example 5 torr. Then, the main valve MV is opened to evacuate the reactor 31, for example, to a vacuum on the order of $10^{-3}$ torr through the main valve MV, during which the auxiliary valve SV may be kept either open or closed.

Subsequently, a first film forming process shown in FIG. 4 is carried out. The first film forming process takes, for example, 50 min. In the first film forming process, the valve V3 is kept closed, the valve V1 is opened to supply $NH_3$ gas and $SiH_2Cl_2$ gas, i.e., processing gases for forming a $Si_3N_4$ film, at 1000 sccm and 100 sccm, respectively through the gas supply pipe 41 into the reactor 31, and the unused processing gases and a by-product are exhausted from the reactor 31 through the exhaust pipe 41. This first film forming process is carried out for 50 minutes, for example. The pressure in the reactor 31 is controlled by the pressure control unit 42, for example, at 0.25 torr. A $Si_3N_4$ film 72 is formed on, for example, a polysilicon layer 71 formed on each wafer W as shown in FIG. 5. Since $NH_4Cl$ has the property of depositing when cooled, $NH_4Cl$ is trapped by the water-cooled trap 6.

Ammonium chloride ($NH_4Cl$) has the property of not depositing in the exhaust passage even if the exhaust passage has a small conductance; that is $NH_4Cl$ deposits slightly or scarcely in the disk trap 5, the main valve MV and the auxiliary valve SV, which have conductances smaller than that of the exhaust pipe 41. Thus, even if $NH_4Cl$ flows together with the exhaust gas through the disk trap 5 and the main valve MV, or through the auxiliary valve SV, $NH_4Cl$ deposits slightly or scarcely if the disk trap 5 and the main valve MV or the auxiliary valve SV are heated, for example, at 150° C. Thus, the disk trap 5 is heated in the first film forming process to avoid the adhesion of NH4Cl to the surfaces of the disk trap 5 by sublimation.

Then, an exhaust process (FIG. 4) is carried out. In the exhaust process, the valve V1 is closed to stop supplying the processing gases for forming the $Si_3N_4$ film, the main valve MV is opened and the vacuum pump 53 is operated to evacuate the reactor 31 to $10^{-3}$ torr.

Subsequently, a second film forming process (FIG. 4) is carried out. In the second film forming process, the reactor 31 is heated by the heating furnace 33 so that the interior of the reactor 31 is heated uniformly at, for example, 700° C. Then, the valve V1 is kept closed and the valve V3 is opened to supply TEOS gas, i.e., a processing gas for forming a $SiO_2$ film, is supplied at 200 sccm through the gas supply pipe 39 into the reactor 31, and the unused processing gas and a by-product are exhausted through the exhaust pipe 41. The second film forming process takes, for example, 20 min.

The pressure in the reactor 31 is controlled during the second film forming process to be maintained at, for example, 0.5 torr by the pressure control device 42. At least the section of the exhaust passage 41 upstream of the disk trap 5 is heated to, for example, about 150° C. by means of the heater 44, while the disk trap 5 is maintained at ordinary or room temperature (about 25° C.). This second thermal processing produces a film 73 of $SiO_2$ on the film of $Si_3N_4$ formed on the wafer W as shown in FIG. 5. A by-product, $C_xH_y$, which is produced during the second thermal processing, is trapped by the disk trap 5 which has a conductance smaller than that of the exhaust passage 41 because $C_xH_y$ has a property of adhering to the exhaust passage if the conductance of the passage is small (see the second thermal processing in FIG. 4).

The respective conductances of the main valve MV and the auxiliary valve SV are smaller than that of the exhaust pipe 41. However, since the valves MV and SV are disposed downstream of the disk trap 5 with respect to the flowing direction of the exhaust gas and most part of the $C_xH_y$ is trapped by the disk trap 5, the $C_xH_y$ adheres slightly or scarcely to the inner surfaces of the main valve MV and the auxiliary valve SV. Thus, the main valve MV and the auxiliary valve SV disposed downstream of the disk trap 5 are protected from the adhesion of the $C_xH_y$ by the disk trap 5.

The disk trap 5 may be heated properly during the second film forming process so that $C_xH_y$ removing rate is adjusted properly to avoid performing the maintenance work too often due to a large amount of adhesion of $C_xH_y$ to the disk trap 5.

Finally, a wafer unloading process (FIG. 4) is carried out. In the wafer unloading process, the valve V3 is closed to stop supplying the processing gas for forming the $SiO_2$ film, the main valve MV and the auxiliary valve SV are closed, the cap 32 is removed, and the wafers W are unloaded from the reactor 31. Since the main valve MV and the auxiliary valve SV are closed during the wafer unloading process, the $NH_4Cl$ trapped by the water-cooled trap 6 is prevented from flowing back into the reactor 31.

In the above described thermal processing system embodying the present invention, the disk trap 5, the main valve MV, the auxiliary valve SV and the water-cooled trap 6 are arranged in that order on the exhaust passage from the upstream side toward the downstream side, and the part of the exhaust pipe on the upstream side of the water-cooled trap 6, the main valve MV, the auxiliary valve SV and the disk trap 5 are heated by the heaters 44 and 51. When forming a $Si_3N_4$ film, the part of the exhaust pipe on the upstream side of the water-cooled trap 6, the main valve MV, the auxiliary valve SV and the disk trap 5 are heated, and the water-cooled trap 6 is cooled. Therefore $NH_4Cl$, i.e., the by-product, can be effectively trapped by the water-cooled trap 6. When forming a $SiO_2$ film, the part of the exhaust pipe 41 on the upstream side of the disk trap 5 is heated to trap $C_xH_y$, i.e., the by-product, can be effectively trapped by the disk trap 5.

The reverse flow of particles of $NH_4Cl$ from the water-cooled trap 6 can be prevented by closing the main valve MV and the auxiliary valve SV when unloading the wafers W from the reactor 31. Since the reduction of suction and the flow of particles can thus be suppressed, the first and the second film forming process for forming the $Si_3N_4$ film and the $SiO_2$ film can be successively carried out by the thermal processing system. Accordingly, any detrimental oxide film is not formed between the $Si_3N_4$ film 72 and the $SiO_2$ film 73. Since the wafers W are not loaded into and unloaded from the reactor 31 during the first and the second film forming process, the wafers will not be contaminated with particles. Consequently, a multilayer insulating film of a satisfactory film quality can be formed by the thermal processing system of the present invention.

Since the component films of the multilayer insulating film are formed successively by the same thermal processing system, the multilayer insulating film can be formed at a throughput far higher than that at which those films are formed by separate systems, and the actual time necessary for forming the multilayer insulating film can be curtailed, and the thermal processing system requires a floor space far less than that is required by the conventional thermal processing systems. Since the wafers need not be transferred from one to the other thermal processing system, there is no possibility of damaging the wafers.

As the film forming process using TEOS is repeated, the amount of products of reaction deposited on the inner surface of the reactor 31 increases, and the reactor 31, the disk trap 5 and the exhaust pipe 51 needs cleaning if the amount of the deposited products of reaction exceeds a certain level. A cleaning system under development is capable of cleaning the reactor 31, the disk trap 5 and the exhaust pipe 51 without dismantling the thermal processing system by using HF gas or $ClF_3$ gas to facilitate cleaning work and to reduce the downtime of the thermal processing system to the least possible extent. This cleaning system is unable to clean the reactor 31, the disk trap 5 and the exhaust pipe 51 unless the same are not heated. Since the disk trap 5 is provided with the second heater 51, the disk trap 5 can be cleaned by this cleaning system, which improves the rate of operation of the thermal processing system.

The present invention is applicable also to forming a TiN film on an object by the reaction of $TiCl_4$ gas and $NH_3$ gas, in which $NH_4Cl$ is produced as a by-product, to forming a film by using an inorganic silicon compound other than TEOS as a processing gas, to forming a multilayer insulating film by forming an oxide film first and forming a nitride film on the oxide film. Furthermore, the present invention is applicable to forming a $SiO_2/Si_3N_4/SiO_2$ multilayer insulating film by successively carrying out an oxide film forming process for forming a $SiO_2$ film, a nitride film forming process for forming a $Si_3N_4$ film and an oxide film forming process for forming a $SiO_2$ film. The present invention may be applied to forming thin films other than the multilayer insulating film.

Although the invention has been described in its preferred embodiment with a certain degree of particularity, obviously many changes and variations are possible therein. It is therefore to be understood that the present invention may be practiced otherwise than as specifically described herein without departing from the scope and spirit thereof.

What is claimed is:

1. A thermal processing system comprising:

a single thermal processing unit for successively processing an object to be processed in a hot atmosphere by both a first thermal process which produces a by-product having a property of drifting and not depositing in an exhaust passage even if the passage has a small conductance, and a second thermal process which produces a by-product having a property of adhering to the passage if the passage has a small conductance;

said exhaust passage being connected to the thermal processing unit;

a first trap provided in the exhaust passage;

a valve provided in the exhaust passage downstream of the first trap with respect to a flowing direction of a gas in the exhaust passage;

a second trap provided with cooling means and disposed in the exhaust passage downstream of the valve with respect to the flowing direction of the gas in the exhaust passage;

means for heating a section of the exhaust passage upstream of said first trap;

means for heating the first trap;

means for heating the exhaust passage between the first trap and the second trap as well as said valve;

all of the heating means being operated to prevent deposition of the by-product and the second trap being cooled to arrest the by-product, while the first thermal process is being carried out; and at least the means for heating a portion of the exhaust passage upstream of the first trap being operated to prevent deposition of the by-product, and the first trap operating to arrest the by-product while said second thermal process is being carried out.

2. The thermal processing system according to claim 1, wherein said first thermal process is a film forming process which produces ammonium chloride as a by-product.

3. The thermal processing system according to claim 1, wherein said second thermal process is a film forming process for producing a silicon dioxide film by using an organic silicon compound as a source gas.

4. The thermal processing system according to claim 1, wherein said exhaust passage is provided with a pressure control device.

5. The thermal processing system according to claim 1, further comprising an auxiliary exhaust passage provided in parallel to the exhaust passage, and an auxiliary valve provided in the bypass pipe.

6. The thermal processing system according to claim 1, wherein said second trap is a water-cooled trap.

7. The thermal processing system according to claim 1, wherein said first trap is a disk trap.

* * * * *